(12) United States Patent
Salter et al.

(10) Patent No.: US 11,130,424 B2
(45) Date of Patent: Sep. 28, 2021

(54) VEHICLE SEATING ASSEMBLY HAVING CAPACITIVE PROXIMITY SENSOR

(71) Applicant: Ford Global Technologies, LLC, Dearborn, MI (US)

(72) Inventors: Stuart C. Salter, White Lake, MI (US); Jerry R. Brown, Northville, MI (US); Sean Bayle West, Monroe, MI (US); Pietro Buttolo, Dearborn Heights, MI (US); James Robert Chascsa, II, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/800,330

(22) Filed: Feb. 25, 2020

(65) Prior Publication Data

US 2021/0146800 A1 May 20, 2021

Related U.S. Application Data

(63) Continuation-in-part of application No. 16/689,596, filed on Nov. 20, 2019.

(51) Int. Cl.
*B60N 2/02* (2006.01)
*B60N 2/06* (2006.01)
*B60N 2/90* (2018.01)
*H03K 17/96* (2006.01)
*B60N 2/20* (2006.01)

(52) U.S. Cl.
CPC ......... *B60N 2/0228* (2013.01); *B60N 2/0232* (2013.01); *B60N 2/06* (2013.01); *B60N 2/20* (2013.01); *B60N 2/919* (2018.02); *H03K 17/9622* (2013.01); *B60N 2002/924* (2018.02); *H03K 2217/960755* (2013.01)

(58) Field of Classification Search
CPC .... B60N 2/0228; B60N 2/919; B60N 2/0232; B60N 2002/0268; B60N 2002/0272
USPC ............... 297/217.3; 324/658–663, 679–686
See application file for complete search history.

(56) References Cited

U.S. PATENT DOCUMENTS

| | | | |
|---|---|---|---|
| 6,392,550 B1 * | 5/2002 | Najor | A61B 5/18 340/439 |
| 6,452,514 B1 * | 9/2002 | Philipp | G01D 5/2405 178/18.06 |
| 6,724,324 B1 * | 4/2004 | Lambert | H03K 17/955 324/663 |
| 8,933,708 B2 * | 1/2015 | Buttolo | H03K 17/955 324/647 |
| 9,568,527 B2 * | 2/2017 | Buttolo | G01R 27/2605 |

(Continued)

FOREIGN PATENT DOCUMENTS

DE 102014117823 A1 6/2016

*Primary Examiner* — Kyle J. Walraed-Sullivan
(74) *Attorney, Agent, or Firm* — David Coppiellie; Price Heneveld LLP

(57) ABSTRACT

A vehicle seating assembly is provided that includes a seat base, a seat back pivotally coupled to the seat base and having a front portion and a rear portion, and an actuator operable to change a position of the seating assembly. The assembly also includes a capacitive proximity sensor located on the seat back and configured to detect a user touch command and a user pressure command, and a controller for receiving the user touch command and pressure command and controlling the actuator to change a position of the seating assembly based on a user input.

18 Claims, 12 Drawing Sheets

(56) References Cited

U.S. PATENT DOCUMENTS

| | | | | |
|---|---|---|---|---|
| 2003/0056997 | A1* | 3/2003 | Breed | B60N 2/015 177/144 |
| 2003/0116362 | A1* | 6/2003 | Breed | B60N 2/829 177/25.13 |
| 2003/0121704 | A1* | 7/2003 | Breed | B60R 21/01516 177/144 |
| 2006/0164254 | A1* | 7/2006 | Kamizono | B60R 21/01532 340/667 |
| 2006/0243579 | A1* | 11/2006 | Bieck | H01H 13/702 200/511 |
| 2008/0186192 | A1* | 8/2008 | Yamanaka | B60R 21/01532 340/667 |
| 2011/0146400 | A1* | 6/2011 | Humbert | G01N 27/223 73/335.04 |
| 2012/0223723 | A1* | 9/2012 | Mamigonians | G01L 1/142 324/649 |
| 2013/0307610 | A1* | 11/2013 | Salter | H03K 17/955 327/517 |
| 2014/0210239 | A1 | 7/2014 | Yetukuri et al. | |
| 2014/0253219 | A1* | 9/2014 | Caffee | B81B 7/0045 327/516 |
| 2014/0265477 | A1 | 9/2014 | Yetukuri et al. | |
| 2015/0097581 | A1* | 4/2015 | Astley | G01R 27/2605 324/658 |
| 2015/0217680 | A1* | 8/2015 | Agajanian | B60Q 1/50 340/468 |
| 2016/0112044 | A1* | 4/2016 | Salter | H03K 17/955 307/116 |
| 2016/0280095 | A1* | 9/2016 | Frye | B60N 2/206 |
| 2016/0344386 | A1* | 11/2016 | Buttolo | H03K 17/955 |
| 2016/0364979 | A1* | 12/2016 | Warren | G08C 17/02 |
| 2017/0057379 | A1* | 3/2017 | Wang | B60N 2/002 |
| 2017/0166089 | A1* | 6/2017 | Frye | B60N 2/0296 |
| 2017/0331474 | A1* | 11/2017 | Jiao | G01B 7/023 |
| 2017/0361733 | A1* | 12/2017 | Gage | B60N 2/666 |
| 2018/0062649 | A1* | 3/2018 | Salter | B60R 25/23 |
| 2018/0065521 | A1* | 3/2018 | Vela | B64D 11/064 |
| 2018/0105069 | A1* | 4/2018 | Nasca | B60N 2/0232 |
| 2018/0178681 | A1* | 6/2018 | Yogo | B60N 3/06 |
| 2018/0266978 | A1* | 9/2018 | Salter | B60J 1/002 |
| 2018/0297513 | A1* | 10/2018 | Salter | B60Q 3/82 |
| 2018/0320854 | A1* | 11/2018 | Salter | F21S 45/33 |
| 2018/0361831 | A1* | 12/2018 | Buttolo | B60J 1/2086 |
| 2019/0003877 | A1* | 1/2019 | Aina | G01G 19/12 |
| 2019/0021504 | A1* | 1/2019 | Cho | A61B 5/4561 |
| 2019/0064969 | A1* | 2/2019 | Kiernan | G06F 3/0445 |
| 2019/0092228 | A1* | 3/2019 | Salter | B60Q 1/323 |
| 2019/0118849 | A1* | 4/2019 | Cazzoli | B60R 21/203 |
| 2019/0176670 | A1* | 6/2019 | Scott | B60N 2/829 |
| 2019/0283629 | A1* | 9/2019 | Kobayashi | B60N 2/22 |
| 2019/0299830 | A1* | 10/2019 | Alequin | A61H 1/001 |
| 2019/0310112 | A1* | 10/2019 | Prando | H03K 17/955 |
| 2020/0010046 | A1* | 1/2020 | Sugamata | B60N 2/688 |
| 2020/0010089 | A1* | 1/2020 | Ford | B60W 20/10 |
| 2020/0049650 | A1* | 2/2020 | Nackaerts | G01N 33/34 |
| 2020/0052695 | A1* | 2/2020 | Bauer | H03K 17/955 |
| 2020/0062156 | A1* | 2/2020 | Little | B60N 2/829 |
| 2020/0079248 | A1* | 3/2020 | Yamamoto | B60N 2/002 |
| 2020/0083886 | A1* | 3/2020 | Vemulapati | H03K 17/955 |
| 2020/0139850 | A1* | 5/2020 | Salter | B60N 2/206 |
| 2020/0192501 | A1* | 6/2020 | Salter | G06F 3/04166 |
| 2020/0233540 | A1* | 7/2020 | Salter | B60R 25/23 |
| 2020/0324675 | A1* | 10/2020 | Yamamoto | B60N 2/976 |
| 2020/0346106 | A1* | 11/2020 | Lee | A63F 13/218 |
| 2020/0361440 | A1* | 11/2020 | Uyeki | B60K 6/48 |
| 2020/0408619 | A1* | 12/2020 | Rizzi | G01L 1/162 |

\* cited by examiner

VEHICLE SEATING ASSEMBLY HAVING CAPACITIVE PROXIMITY SENSOR

CROSS-REFERENCE TO RELATED APPLICATION

This application is a continuation-in-part of U.S. patent application Ser. No. 16/689,596 filed Nov. 20, 2019, entitled "CAPACITIVE PROXIMITY SENSOR ASSEMBLY HAVING MULTIPLE SENSING CONFIGURATIONS." The aforementioned related application is hereby incorporated by reference.

FIELD OF THE DISCLOSURE

The present invention generally relates to a vehicle seating assembly, and more particularly relates to a seating assembly having a switch positioned on the vehicle seat and configured to control an operation of the seat.

BACKGROUND OF THE DISCLOSURE

Vehicle seating assemblies typically include a seat back, a seat base and may further include a motorized system configured to pivot the seat back relative to the seat base for the convenience of a vehicle occupant seated in the seating assembly. Vehicle seating assemblies typically include an actuation switch that allows a user to operate the motorized system or unlatch and fold the seat back forward. However, the actuation switch is often located in an area that may be inconvenient for the vehicle occupant to access when the vehicle occupant is not seated in the seating assembly. It may be desirable to provide for an enhanced actuation system for controlling various operations of the seating assembly.

SUMMARY OF THE DISCLOSURE

According to a first aspect of the present invention, a vehicle seating assembly is provided. The vehicle seating assembly includes a seat base, a seat back pivotally coupled to the seat base and having a front portion and a rear portion, an actuator operable to change a position of the seating assembly, a capacitive proximity sensor configured to detect a user touch command and a user pressure command, and a controller for receiving the user touch command and pressure command and controlling the actuator to change the position of the seating assembly based on a user input.

Embodiments of the first aspect of the invention can include any one or a combination of the following features:
  the capacitive proximity sensor is located near an upper portion of the seat back;
  the capacitive proximity sensor is located on a rear portion of the seat back;
  the capacitive proximity sensor is located on a front portion of the seat back;
  the vehicle seating assembly comprises a first capacitive proximity sensor and a second capacitive proximity sensor, wherein the first and second proximity sensors are located proximate one another on one side of the seat back;
  the capacitive proximity sensor comprises a first electrode, a second electrode, a first compliant dielectric layer disposed between a first and second electrode, and wherein the controller processes signals associated with the first and second electrodes and selectively reconfigures operation of the first and second electrodes and different proximity sensor arrangements to provide a touch capacitive sensor and a pressure capacitive sensor;
  the first electrode comprises a pair of electrodes that are configurable to generate a mutual capacitance to provide a first capacitance sensor and are further configurable to generate a self-capacitance to provide a second capacitive sensor;
  the pair of electrodes comprises a first plurality of capacitive fingers and a second plurality of capacitive fingers, wherein the first plurality of capacitive fingers are interdigitated with the second plurality of capacitive fingers;
  the first and second electrodes provide a third capacitive sensor; and
  the controller sequentially samples signals associated with each of the first, second and third capacitive sensors.

According to a second aspect of the present invention, a vehicle seating assembly is provided. The vehicle seating assembly includes a seat base, a seat back pivotally coupled to the seat base and having a front portion and a rear portion, an actuator operable to change a position of the seating assembly, a capacitive proximity sensor located on the seat back and configured to detect a user touch command and a user pressure command, and a controller for receiving the user touch command and pressure command and controlling the actuator to change a position of the seat back based on a user input.

Embodiments of the second aspect of the invention can include any one or a combination of the following features:
  the capacitive proximity sensor is located near an upper portion of the seat back;
  the capacitive proximity sensor is located on a rear portion of the seat back;
  the capacitive proximity sensor is located on a front portion of the seat back;
  the vehicle seating assembly comprises a first capacitive proximity sensor and a second capacitive proximity sensor, wherein the first and second proximity sensors are located proximate one another on one side of the seat back;
  the capacitive proximity sensor comprises a first electrode, a second electrode, a first compliant dielectric layer disposed between a first and second electrode, and wherein the controller processes signals associated with the first and second electrodes and selectively reconfigures operation of the first and second electrodes and different proximity sensor arrangements to provide a touch capacitive sensor and a pressure capacitive sensor;
  the first electrode comprises a pair of electrodes that are configurable to generate a mutual capacitance to provide a first capacitance sensor and are further configurable to generate a self-capacitance to provide a second capacitive sensor;
  the pair of electrodes comprises a first plurality of capacitive fingers and a second plurality of capacitive fingers, wherein the first plurality of capacitive fingers are interdigitated with the second plurality of capacitive fingers;
  the first and second electrodes provide a third capacitive sensor; and
  the controller sequentially samples signals associated with each of the first, second and third capacitive sensors.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1A:
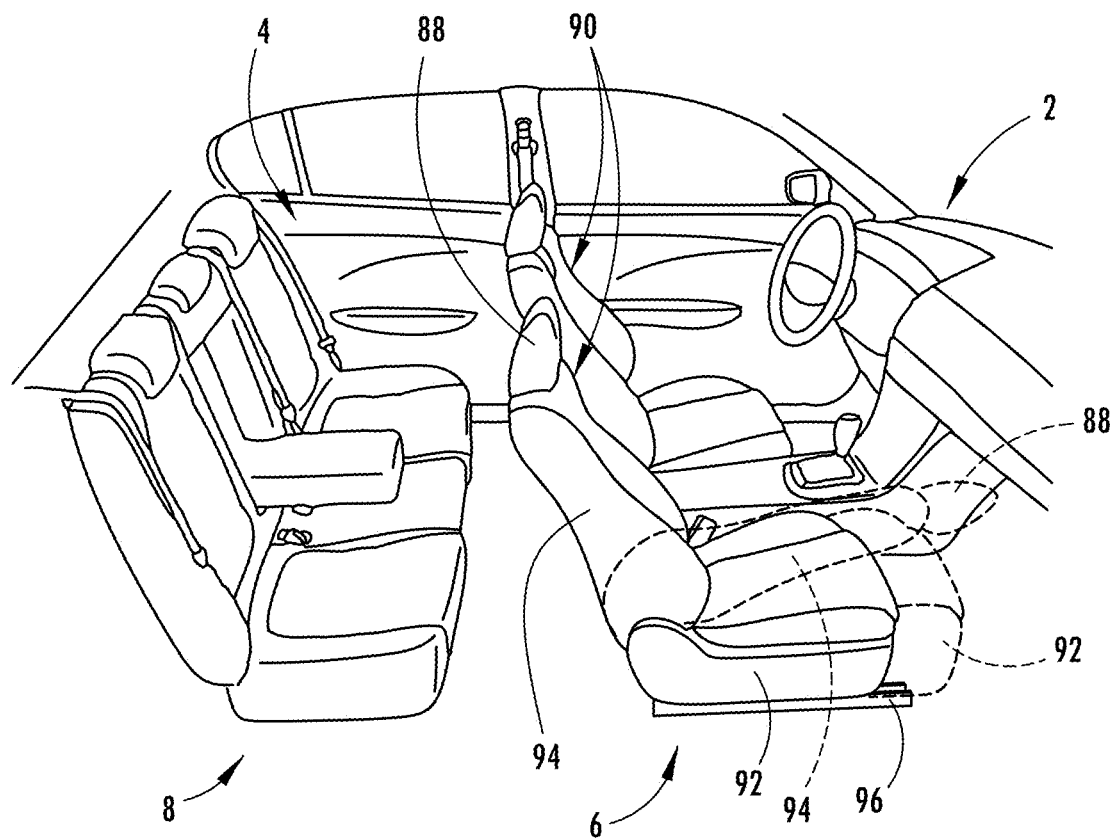
FIG. 1A is a side perspective view of a passenger compartment of a motor vehicle having an arrangement of seating assemblies, according to one embodiment.
Figure 1B:
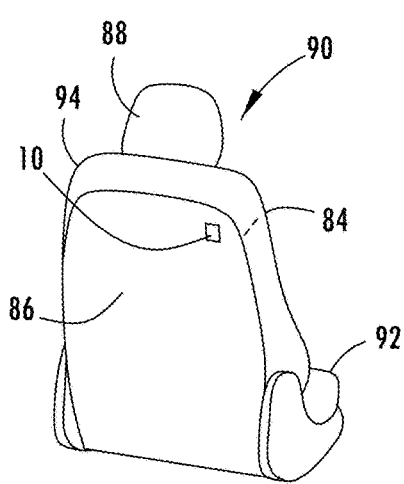
FIG. 1B is a rear perspective view of one of the front row seating assemblies having a capacitive proximity sensor located on the upper rear side of the seat back, according to one embodiment.
Figure 2:
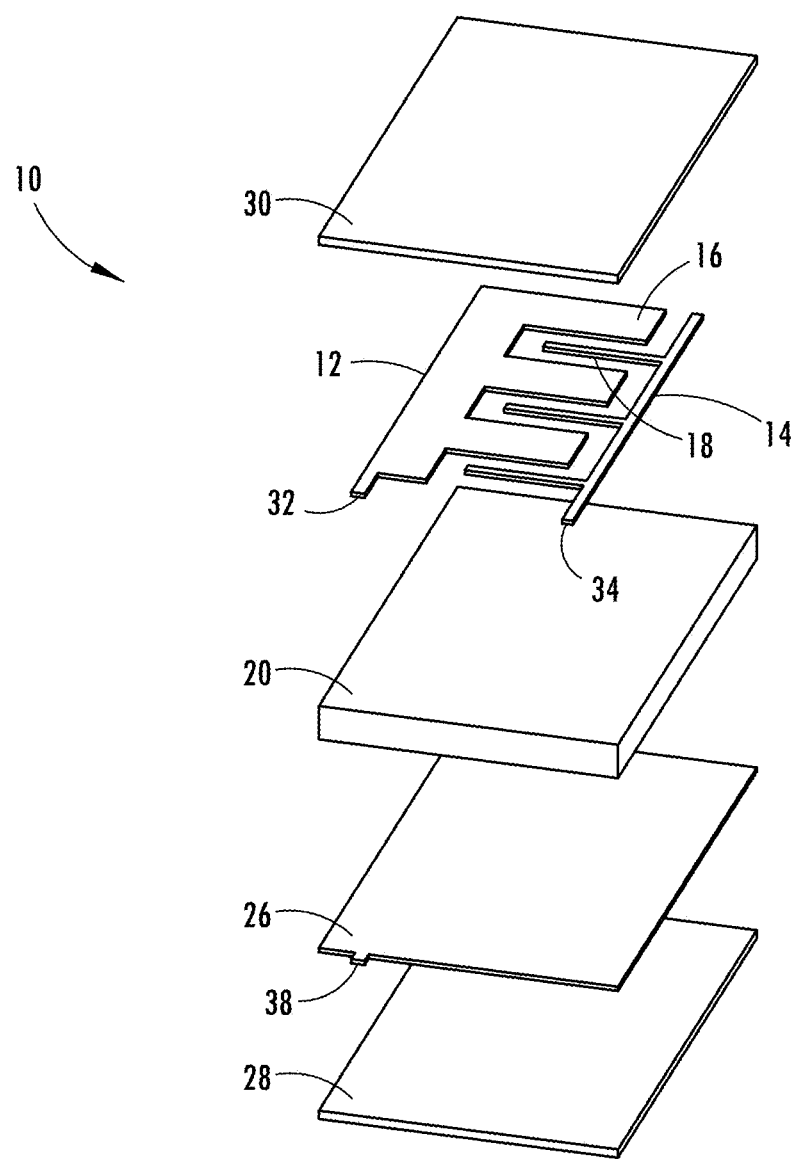
FIG. 2 is an exploded upper front perspective view of a capacitive proximity sensor assembly, according to a first embodiment.

For purposes of description herein, the terms "upper," "lower," "right," "left," "rear," "front," "vertical," "horizontal," and derivatives thereof shall relate to the concepts as oriented in FIGS. 1A, 1B and 2. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The present illustrated embodiments reside primarily in combinations of method steps and apparatus components related to a vehicle seating assembly. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Referring now to FIG. 1A, a motor vehicle 2 is generally illustrated having a passenger compartment 4 equipped with a first or front row 6 of seating assemblies and a second or rear row 8 of seating assemblies. The front row 6 of seating assemblies may include a driver side seating assembly positioned rearward of a steering wheel and a passenger side seating assembly laterally offset from the driver side seating assembly. The rear row 8 of seating assemblies may include two or three seating assemblies positioned rearward of the front row 6 of seating assemblies. It should be appreciated that the front row 6 of seating assemblies may be a middle second row of seating assemblies and the rear row 8 of seating assemblies may be a third row of seating assemblies located rearward of the front row 6 of seating assemblies in a three row seating arrangement.

The front row 6 of seating assemblies includes vehicle seating assemblies 90 that may be controlled to move into different positions including a folded seat position and may be actuated in multiple directions such as forward and backward directions, up and down and other directions with the use of actuators, such as motors. Each seating assembly 90 includes a seat base 92 and a seat back 94. The seat back 94 may further include a headrest 88. The seat back 94 may rotate or pivot about an axis 98 between an upright position and a folded forward position as seen in FIG. 1A. It should be appreciated that the front row 6 of seating assemblies may be configured with seating assemblies 90 that may be controllably moved to a position to better enable occupants in the rear seating assembly area to enter and exit the vehicle 2. This may include controlling the seating assembly 90 to fold the seat back 94 forward and downward to a substantially flat folded position above the seat base 92 and actuating the seat base 92 forward on a motorized track 96 to provide a greater amount of space in front of the rear row 8 of seating assemblies to enable passengers to enter and exit the rear row 8 of seating assemblies.

Figure 1C:
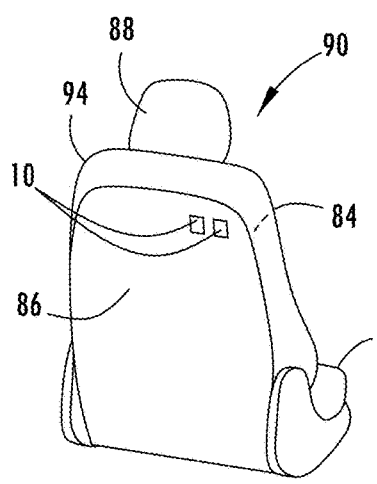
FIG. 1C is a rear perspective view of a front row seating assembly having a pair of capacitive proximity sensors located in an upper rear side of the seat back, according to another embodiment.

To control the seating assembly 90, such as to move or to fold the seat back 94 forward or to power the seat track forward or rearward, the seating assembly 90 is equipped with a capacitive proximity sensor 10 to enable a user to input user commands. Referring to FIG. 1B, the capacitive proximity sensor 10 is shown located on the rear side 86 of the seating assembly 90 at a location near an upper corner region of the seat back 94. This enables an occupant in the rear seating row 8 to reach forward and activate the capacitive proximity sensor 10 to enter a control command to fold the seat back 94 forward to a folded position and/or otherwise actuate the seat forward to enable enhanced entry and exiting for passengers in the rear rows of seating assemblies of the vehicle. In this embodiment, a single capacitive proximity sensor 10 is located on the seat back 94. According to another embodiment, the seating assembly 90 may include first and second capacitive proximity sensors 10 located side-by-side on the seat back rear surface as shown in FIG. 1C. This enables the control system to detect a user's fingers moving left or right across the pair of capacitive proximity sensors to enable detection of whether the user is entering an input command from a left or right side of the seat such that a gesture direction may be determined. In addition, one proximity sensor may be used as an input to fold the seat back and the other proximity sensor may be used as an input to move the seat forward or rearward.

Figure 1D:
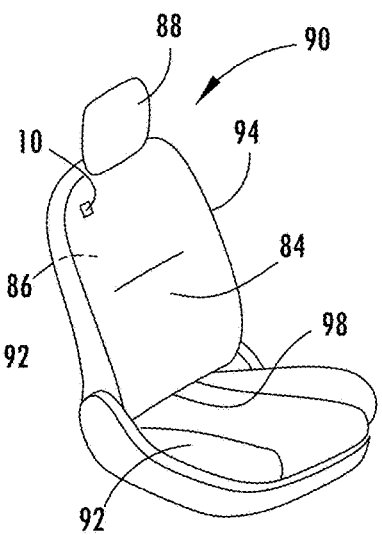
FIG. 1D is a front perspective view of a front row seating assembly having a capacitive proximity sensor located in an upper front side of the seating assembly, according to a further embodiment.

Referring to FIG. 1D, the capacitive proximity sensor 10 is shown located on the front surface 84 of the seat back 94, according to another embodiment. The use of a capacitive proximity sensor 10 on the front surface 84 of the seat back 94 enables the user to enter a command to move the seat back 94 from the folded forward position to the upright use position. It should be appreciated that the capacitive proximity sensor 10 may include one or more sensors located on the rear surface of the seat back 94 and/or on the front surface 84 of the seat back 94 and on one or both the front and rear sides of the seat back 94, according to various embodiments.

Figure 1E:
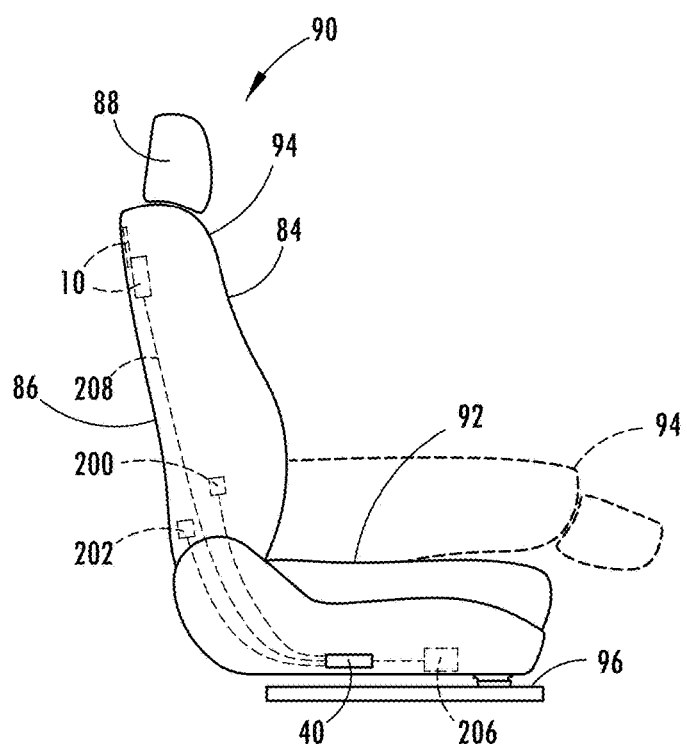
FIG. 1E is a side perspective view of a front row seating assembly having various components associated therewith, according to one embodiment.

The seating assembly 90 is further illustrated in FIG. 1E with the seat back 94 in both the upright seating position and a folded forward position shown in dashed lines. The seating assembly 90 is further illustrated having a motor 206 wired to a controller 40 for controlling the motor 206 to actuate the seat forward and backward along the track 96. The seating assembly 90 also includes a mechanical latch 200 which has a solenoid configured to release the latch 200 to allow the seat back 94 to fold forward to the folded position. A limit switch 202 senses when the mechanical latch 200 is in the latched position or not. The capacitive proximity sensor assembly 10 is shown wired to the controller 40 which, in turn, is wired to each of the motor 206, limit switch 202 and the latch 200 and solenoid via wires 208. It should be appreciated that the capacitive proximity sensor assembly 10 may include various electronics associated therewith.

Referring now to FIGS. 2-8, a proximity sensor assembly in the form of a capacitive sensor assembly 10 is illustrated, according to a first embodiment. The capacitive proximity sensor assembly 10 includes a pair of first and second electrodes 12 and 14 having respective first and second conductive fingers 16 and 18 configurable in one operating mode to produce mutual capacitance to form a mutual capacitance sensor. The capacitive sensor assembly 10 also includes a third electrode 26 and a compliant dielectric layer 20 disposed between the pair of first and second electrodes 12 and 14 and the third electrode 26. The capacitive proximity sensor assembly 10 further includes a controller 40 selectively sampling signals from the first, second and third electrodes and sequentially reconfiguring the operational sensor mode of the electrodes in different proximity sensor operating arrangements or modes to provide a plurality of capacitive sensors that may operate as mutual or self-capacitive sensors.

The capacitive proximity sensor assembly 10, according to the first embodiment shown in FIG. 2, includes three electrodes configured to operate in different sensor modes or states by using a controller to reconfigure the input and output sampling of the signals generated by the various electrodes to operate in different sensor configurations to provide up to three capacitive sensors that may operate as a mutual capacitive sensor or a self-capacitive sensor and to sense input commands, such as touch, proximity and pressure or force.

The arrangement of the electrodes in the capacitive proximity sensor assembly 10 is illustrated in FIG. 2 having the first and second capacitive electrodes 12 and 14 arranged within a common plane or layer and dielectrically isolated from one another via a separation distance. The first electrode 12 has a first plurality of conductive fingers 16 and the second electrode 14 has a second plurality of conductive fingers 18. The first plurality of conductive fingers 16 are interdigitated or interleaved with the second plurality of conductive fingers 18. As a result, the first and second electrodes 12 and 14 may operate in a first mode as a mutual capacitance sensor when one of the electrode signal terminals 32 and 34 is driven with a drive signal and the other of the electrode signal terminals 32 and 34 generates a receive signal when operated in a mutual capacitance mode. When one of the electrode signal terminals 32 and 34 receives a drive signal, that electrode operates as a drive electrode and the other electrode operates as a receive electrode. The drive electrode may receive square wave drive pulses applied at a voltage $V_I$. The receive electrode may have an output for generating an output voltage $V_O$. It should be appreciated that the first and second electrodes 12 and 14 may be arranged in various other configurations for generating a capacitive electric field as an activation field.

In the mutual capacitance sensor mode, the drive electrode is applied with voltage input $V_I$ as square wave pulses having a charge pulse cycle sufficient to charge the receive electrode thereby to a desired voltage. The receive electrode thereby serves as a measurement electrode. When a user or operator, such as a user's finger, enters the activation electric field generally proximate the top front side of the proximity sensor assembly 10, the proximity sensor assembly 10 detects the disturbance caused by the finger to the activation electric field and determines whether the disturbance is sufficient to detect an object such as a touch input sufficient to activate a proximity switch or generate a desired output. The disturbance of the activation electric field is detected by processing the charge pulse signal associated with the corresponding signal.

An overlying dielectric cover 30 is provided on the top front side of the first and second electrodes 12 and 14 to provide dielectric isolation and protection of the first and second electrodes 12 and 14. The dielectric cover 30 may include any dielectric materials, such as a dielectric polymer or plastic, leather, wood, a trim component or other dielectric medium. It should be appreciated that the first and second electrodes 12 and 14 may be formed by printing conductive ink in the desired patterns of the electrodes. The ink may be printed on the rear surface of the dielectric cover 30, according to one embodiment or may be printed on the front surface of the dielectric layer 20 therebelow. The first and second electrodes 12 and 14 may otherwise be formed by placing preformed conductive electrodes between the dielectric cover 30 and the compliant dielectric layer 20.

Disposed below the first and second electrodes 12 and 14 is the compliant dielectric layer 20. The compliant dielectric layer 20 has a relatively soft material that is compliant and deformable when pressure, which is force applied over an area, is applied to the front of the cover 30 so as to squeeze and deform the first compliant dielectric layer 20. According to one example, the compliant dielectric layer 20 may be a soft foam material.

Located below the compliant dielectric layer 30 is a third electrode 26. The third electrode 26 is shown formed as a sheet of conductive material, according to one embodiment. The third electrode 26 has a signal terminal 38 to allow for communication of signals with the controller. The third electrode 26 may operate in one sensor mode as a mutual capacitive sensor that detects pressure applied to the top front surface which causes deformation of the compliant dielectric layer 20. As the compliant dielectric layer 20 is squeezed due to pressure and deforms, at least a portion of the pair of the first and second electrodes 12 and 14, which may be shorted together to form a single electrode or operated individually, moves towards the third electrode 26. When this occurs, the controller detects the relative position of the pair of first and second electrodes 12 and 14 relative to the third electrode 26. In other sensor modes, the third electrode 26 may be open circuited to operate as a shield for the first and second electrodes 12 and 14 located thereabove or the third electrode 26 located therebelow. When operated as a shield, the third electrode 26 may be open circuited such that there is no applied voltage applied or may be driven to a desired voltage, according to various embodiments.

A further bottom dielectric layer 28 is shown provided below the third electrode 26 so as to dielectrically isolate the third electrode 26 on the bottom side. In one embodiment, the bottom dielectric 28 may be a dielectric backing material.

Figure 3:
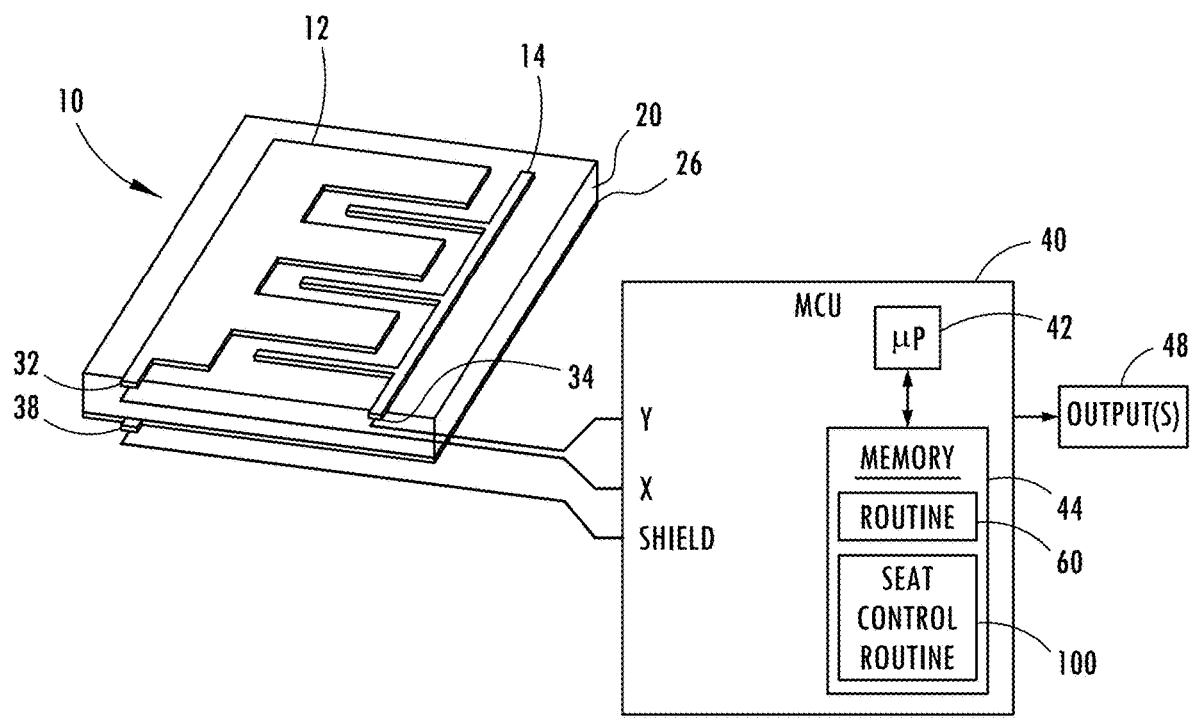
FIG. 3 is a front perspective view of the capacitive proximity sensor assembly shown in FIG. 2 and configured to sample signals in a first sensor mode with a controller.
Figure 4:
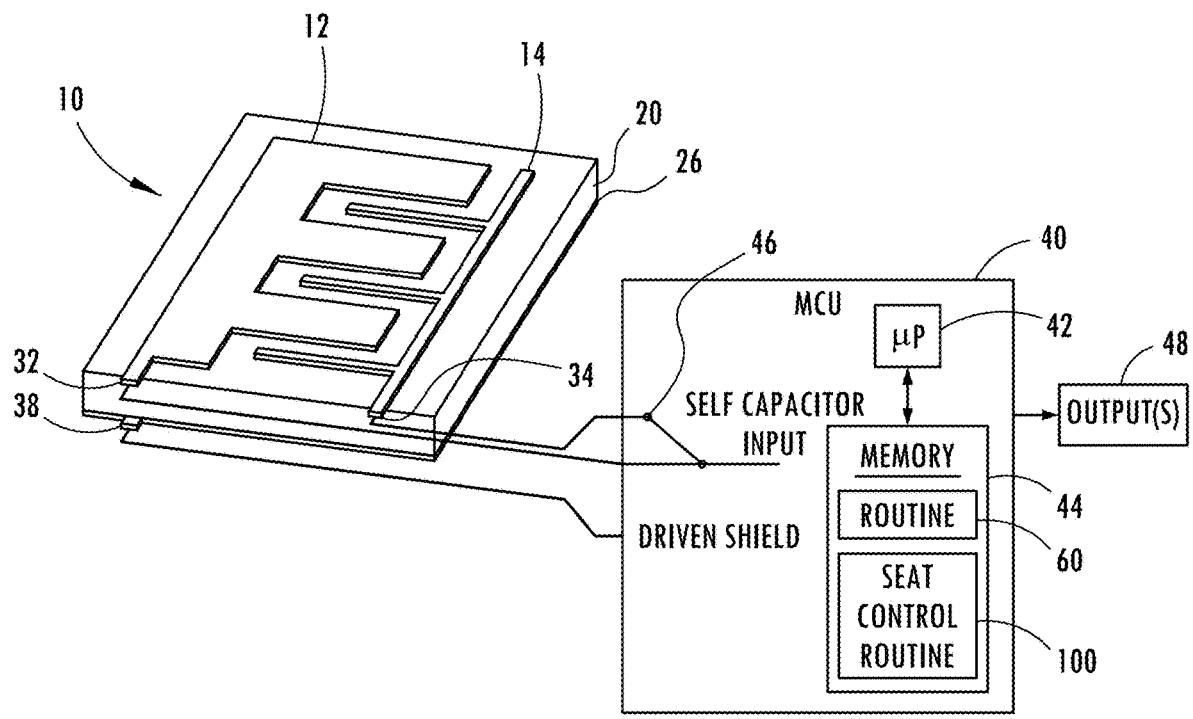
FIG. 4 is a front perspective view of the capacitive proximity sensor assembly shown in FIG. 2 with the controller configured to sample signals in a second sensor mode.
Figure 5:
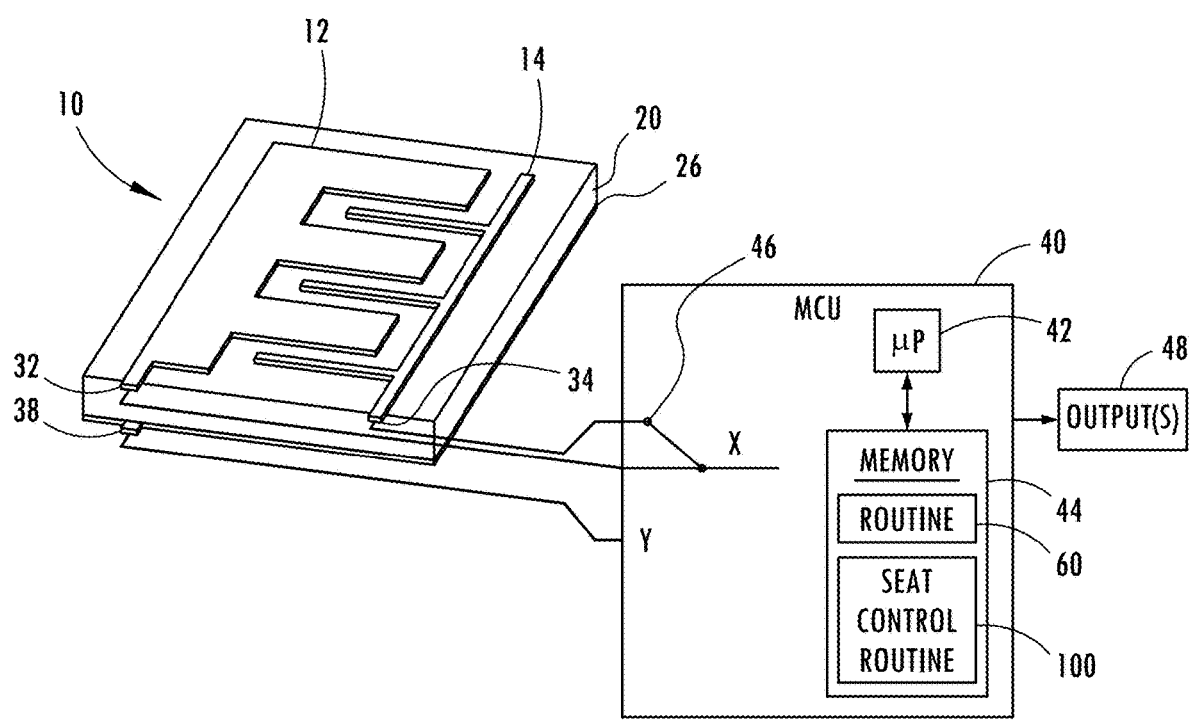
FIG. 5 is a front perspective view of the capacitive proximity sensor assembly shown in FIG. 2 with the controller configured to sample signals in a third sensor mode.

Referring to FIGS. 3-8, the various operating sensor modes of the electrode configurations as controlled by the controller 40 are illustrated for the first embodiment of the capacitive proximity sensor assembly 10. As best seen in FIGS. 3-5, the controller 40 may include a microprocessor 42 and memory 44 configured with one or more routines. The controller 40 may be a micro control unit (MCU) having firmware, according to one example. It should be appreciated that other analog and/or digital circuitry may be used to provide the controller 40. The controller 40 includes various inputs/outputs including three inputs/outputs connected to the respective signal terminals 32, 34 and 38 associated with the first, second and third electrodes 12, 14 and 26. Additionally, the controller 40 may generate one or more outputs 48 based on the sensed signals. For example, the controller 40 may provide proximity switch outputs based on the proximity sensing such that the capacitive proximity sensor assembly 10 operates as one or more capacitive proximity switches, according to various examples.

Figure 6:
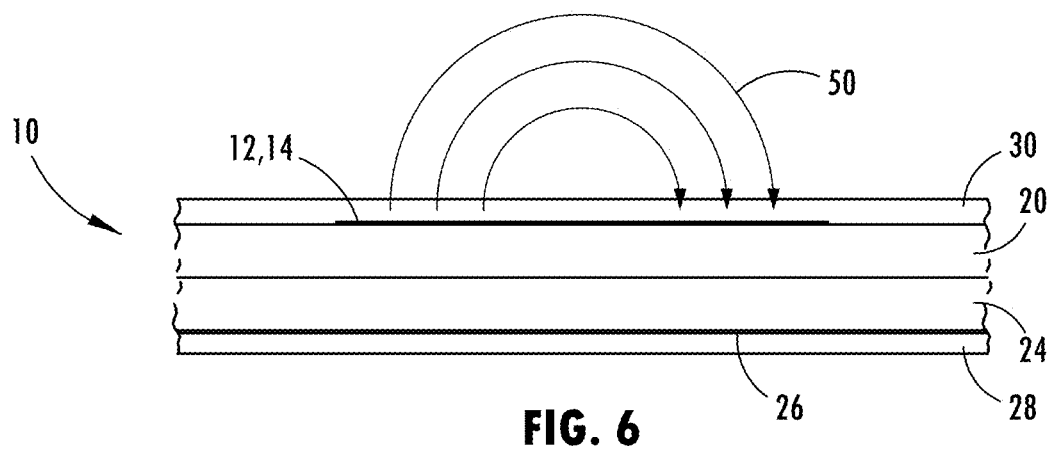
FIG. 6 is a cross-sectional view of the capacitive proximity sensor assembly of FIG. 2 further illustrating the electric field generated in the first sensor mode.

Referring to FIGS. 3 and 6, the proximity sensor assembly 10 is configured according to a first sensor mode in which the first and second electrodes 12 and 14 form a mutual capacitance with each other to serve as a first sensor that may be used to sense touch or close proximity of a user at or near the top front surface of cover 30. In this sensor mode, the third electrode 26 is open-circuited via the controller 40 so as to form a conductive shield that may enhance the mutual capacitance between the first electrode 12 and second electrode 14. The first electrode 12 may receive a drive signal X and the second electrode 14 may supply a receive signal Y. As seen in FIG. 6, the activation electric field is generated due to a mutual capacitive coupling of the first and second electrodes 12 and 14 as illustrated by arrows 50 to enable the detection of touch or movement, e.g., swipe, on or above the front cover 30 (e.g., within 30 millimeters).

Figure 7:
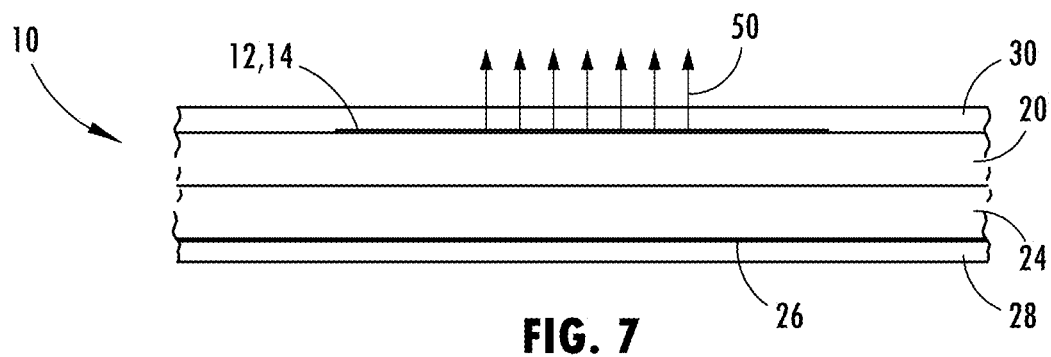
FIG. 7 is a cross-sectional view of the capacitive proximity sensor assembly of FIG. 2 further illustrating the electric field generated in the second sensor mode.

The controller 40 may sequentially switch the capacitive proximity sensor assembly 10 amongst the various sensor modes at a rapid speed simply by changing the inputs and outputs and thereby reconfiguring the sensing arrangement to sequentially provide first, second and third sensors. Referring to FIGS. 4 and 7, the capacitive proximity sensor assembly 10 is shown in the second sensor mode in which the first and second electrodes 12 and 14 are electrically shorted together to form a single electrode, and the third electrode 26 is driven to a desired voltage to provide a shield. To electrically short the first and second electrodes 12 and 14 together, the controller 40 may include a switch 46 that may be implemented in firmware or otherwise implemented with an analog or digital switch. In this sensor mode, the first and second electrodes 12 and 14 which are shorted together receives a self-capacitor input to generate an activation electric field illustrated by arrows 50 to form a self-capacitive second sensor as seen in FIG. 7 in which the activation electric signal may detect objects above the top front cover 30 at an extended distance (e.g., a distance up to 30 centimeters). The self-capacitor input may apply a voltage for half of a cycle to charge the electrode and may sense capacitance during the other half of the cycle.

Figure 8:
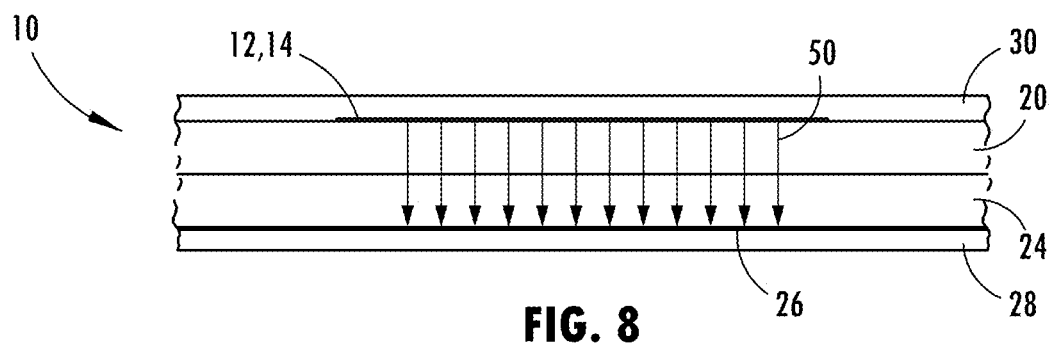
FIG. 8 is a cross-sectional view of the capacitive proximity sensor assembly of FIG. 2 further illustrating the electric field generated in the third sensor mode.

Referring to FIGS. 5 and 8, the capacitive proximity sensor assembly 10 is illustrated in the third sensor mode in which the first and second electrodes 12 and 14 are electrically shorted together via the switch 46 as controlled by controller 40 and receive the drive signal X, and the third electrode 26 supplies the receive signal Y. It should be appreciated that the short circuited first and second electrodes 12 and 14 may receive the drive signal X to form a mutual capacitance with the third electrode 26 to provide a third sensor. As such, movement of the shorted together first and second electrodes 12 and 14 relative to third electrode due to compression of the first compliant dielectric layer 20 may be detected as an indication of the amount of force or pressure applied to the front surface of the cover 30. The activation electric field between the shorted circuited first and second electrodes 12 and 14 and the third electrode 26 is illustrated by arrows 50 in FIG. 8.

Figure 14:
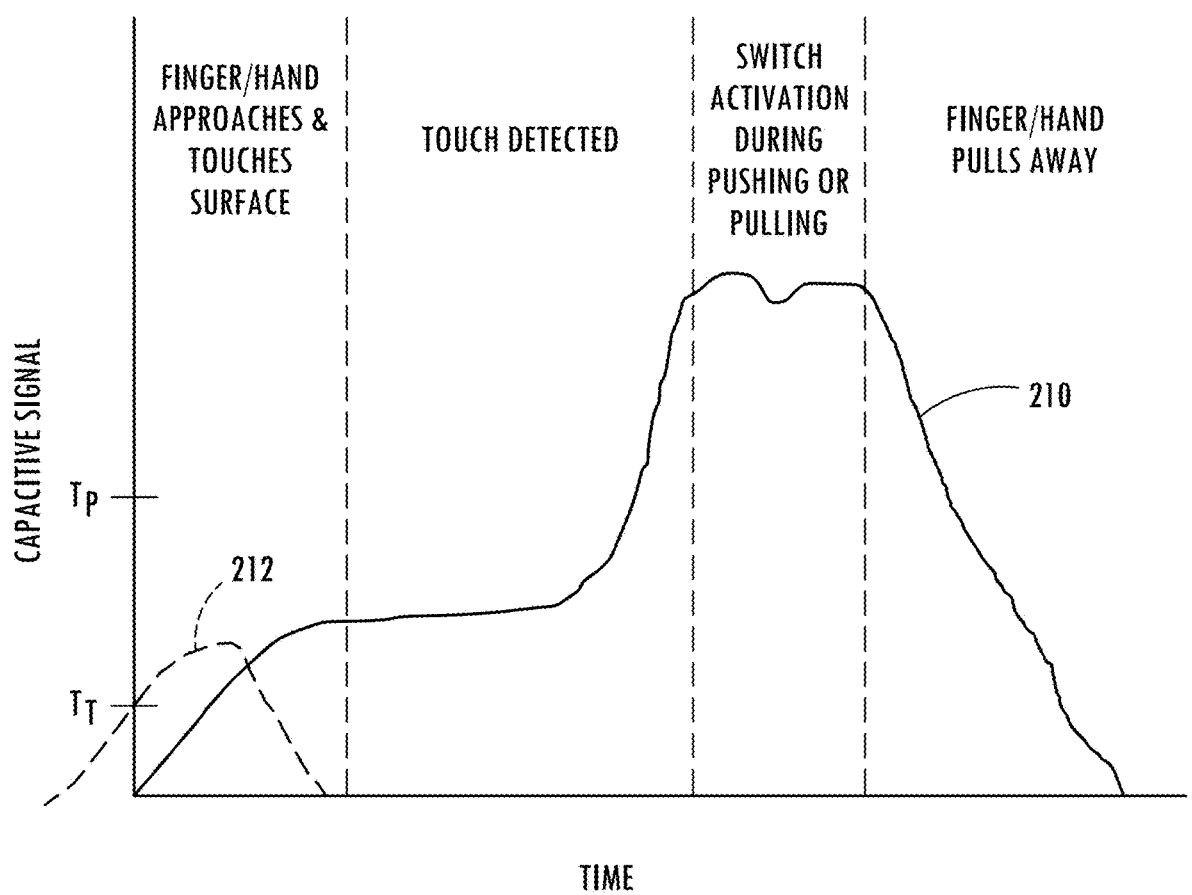
FIG. 14 is a graph illustrating one example of the sensor signals processed during touch and press actuations.

One example of a sensed user hand movement is illustrated in FIG. 14. As seen, signal 210 is generated by a capacitive proximity sensor as a user's hand approaches the capacitive proximity sensor assembly, performs a touch command followed by a pressure command and subsequently removes the hand from the capacitive proximity assembly. As such, the signal 210 initial rises up above a touch threshold $T_T$ where a touch command can be detected. When a touch command is detected, a first output such as activating a light may occur. The signal 210 then is shown rising up above a second threshold $T_P$ indicative of a pressure command whereby the user presses on the assembly to activate a second command, such as to fold the seat forward. This may occur by a user either pushing or pulling on the capacitive sensor assembly. The seat may be folded to the folded position by unlatching the latch with the solenoid or by actuating a motor to actuate the seat back to the folded position. Thereafter, the hand or finger moves away from the assembly and the signal 210 drops below the threshold. In addition, a second signal 212 is illustrated for the embodiment where there are two sensors located side-by-side such as is shown in FIG. 1C. The second signal 212 is generated by second sensor when the finger approach and crosses over the first sensor and drop back down as the finger slides beyond the second sensor. As such, a direction of user input can be detected by detecting the second signal 212 followed by the first signal 210 so as to determine the direction from which the user approaches the sensor assembly.

Accordingly, it should be appreciated that the controller 40 may sequentially switch between the first, second and third sensor modes as illustrated in FIGS. 3-8 at a rapid pace so as to sequentially configure the capacitive proximity sensor assembly 10 in various sensor configurations referred to as first, second and third sensors and sample sensed signals to sense a sensed condition in each sensor mode. This may be achieved by the controller 40 switching the drive signal X and the receive signal Y between the various inputs and outputs and sampling the signals over a short period of time such as 20 milliseconds and then switching sequentially to the next sensor mode, repeatedly. As such, multiple sensors may be realized with the capacitive proximity sensor assembly 10. The sensor signals may be compared to threshold values to act as switches to trigger an output response.

Figure 9:
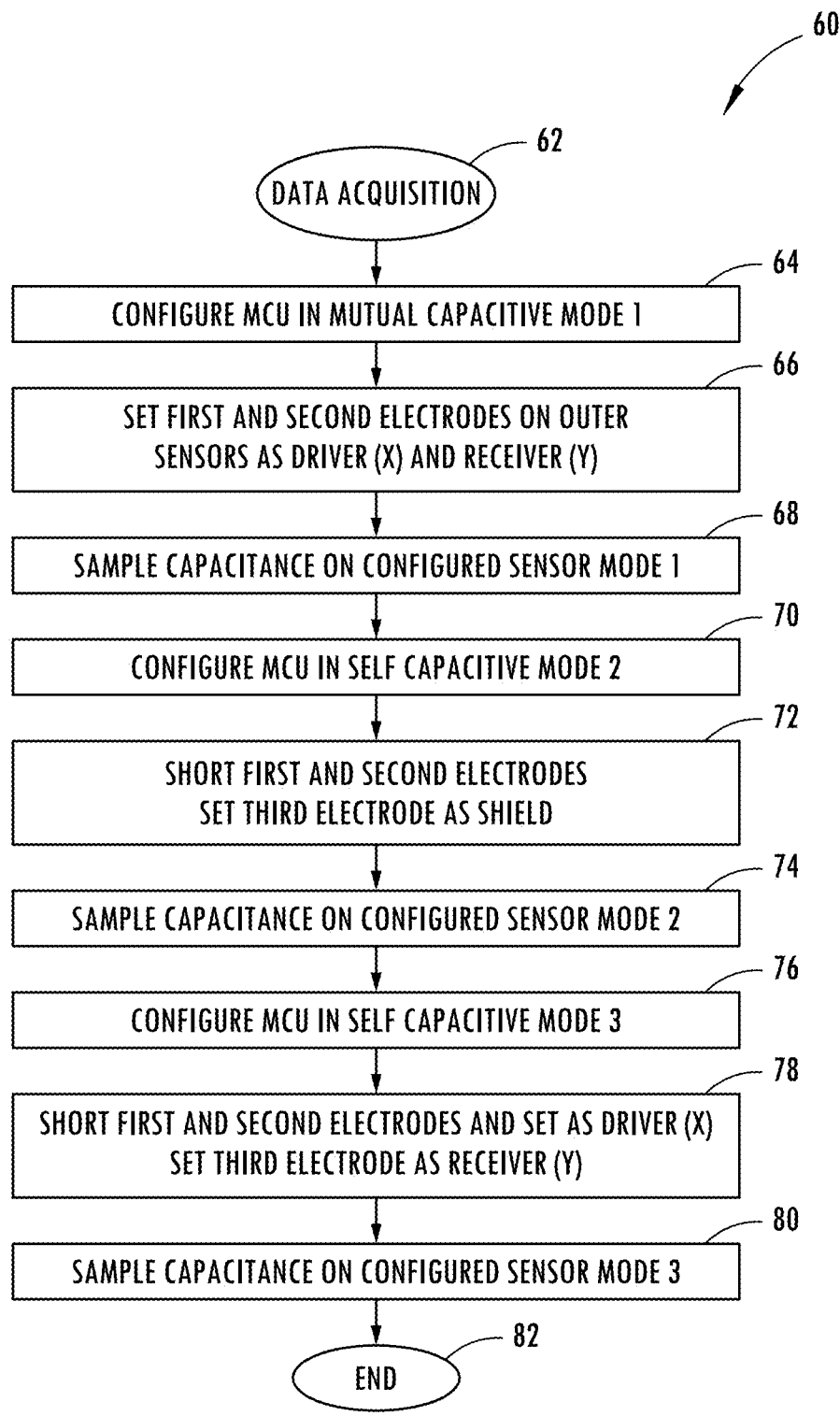
FIG. 9 is a flow diagram illustrating a routine for sampling and measuring signals generated by the capacitive proximity sensor assembly of FIG. 2 in the first, second and third sensor modes.

Referring to FIG. 9, a routine 60 for controlling the controller 40 to sequentially switch the capacitive proximity sensor assembly 10 amongst the various operating modes is illustrated, according to one embodiment. The routine 60 is shown for operating the capacitive proximity sensor assembly 10 according to the first embodiment in each of sensor modes 1-3. It should be appreciated that the routine 60 may be executed by the microprocessor 42 in the controller 40 and that the routine 60 may be stored in memory 44. The routine 60 may sample data and reconfigure the capacitive proximity sensor assembly 10 in the various modes at a sampling rate of about 20 milliseconds, according to one example. It should be appreciated that other sampling rates may be employed.

Routine 60 begins at step 62 to acquire data and then proceeds to step 64 to configure the controller in a first mutual capacitance sensor mode 1. In sensor mode 1, routine 60 proceeds to step 66 to set the first electrode with the drive signal X and to set the second electrode with the drive receive signal Y, and may set the third electrode as a shield. Thereafter, routine 60 proceeds to step 68 to sample the capacitance on the configured mutual capacitance sensor in sensor mode 1. Sensor mode 1 may sense touch commands which may be used to perform a function such as turning on a light or displaying information.

Next, routine 60 proceeds to step 70 to configure the controller in a self-capacitance sensor mode 2. In mode 2, routine 60 proceeds to step 72 to electrically short circuit the first and second electrodes together, and to set the third electrode as a shield. The shorted together first and second electrodes receive a self-capacitance input signal. Next, at step 74, routine 60 samples the capacitance of the configured self-capacitance sensor in sensor mode 2. Sensor mode 2 may be used to turn on an interior light or detect moisture on the seat.

Next, routine 60 proceeds to step 76 to configure the controller in a mutual capacitance sensor mode 3. This includes electrically short circuiting the first and second electrodes together and setting the combined first and second electrodes with the drive signal X, and setting the third electrode with the receive signal Y in step 78. Next, in step 80, the capacitance of the configured mutual capacitance sensor in sensor mode 3 is sampled before ending at step 82. Sensor mode 3 may detect pressure and may be used to unlatch and fold the seat back or actuate the seat forward.

It should be appreciated that the routine 60 may be repeated sequentially at a rapid pace, such that the sampling between the execution of the sensor configurations in modes 1, 2 and 3 may occur at a sampling rate of 20 milliseconds, for example. As a result, the capacitive proximity sensor assembly 10 is able to operate sequentially in multiple modes with different configurations of capacitive sensors to sense various signals, particularly objects and input commands in four sensor modes pursuant to the first embodiment.

Figure 10A:
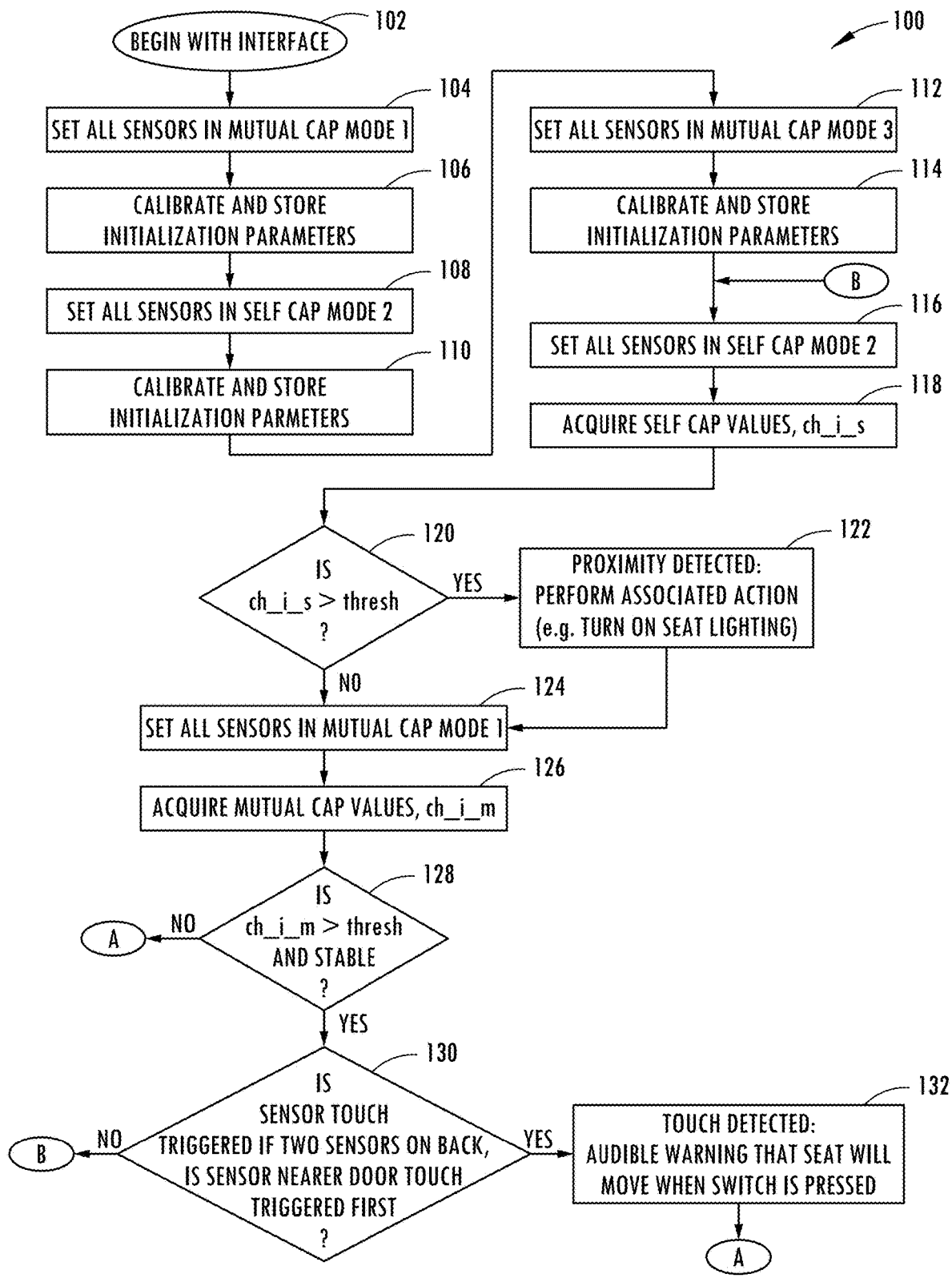
FIGS. 10A-10B is a flow diagram illustrating a routine for controlling the seating assembly with the capacitive proximity sensor of FIG. 2.
Figure 10B:
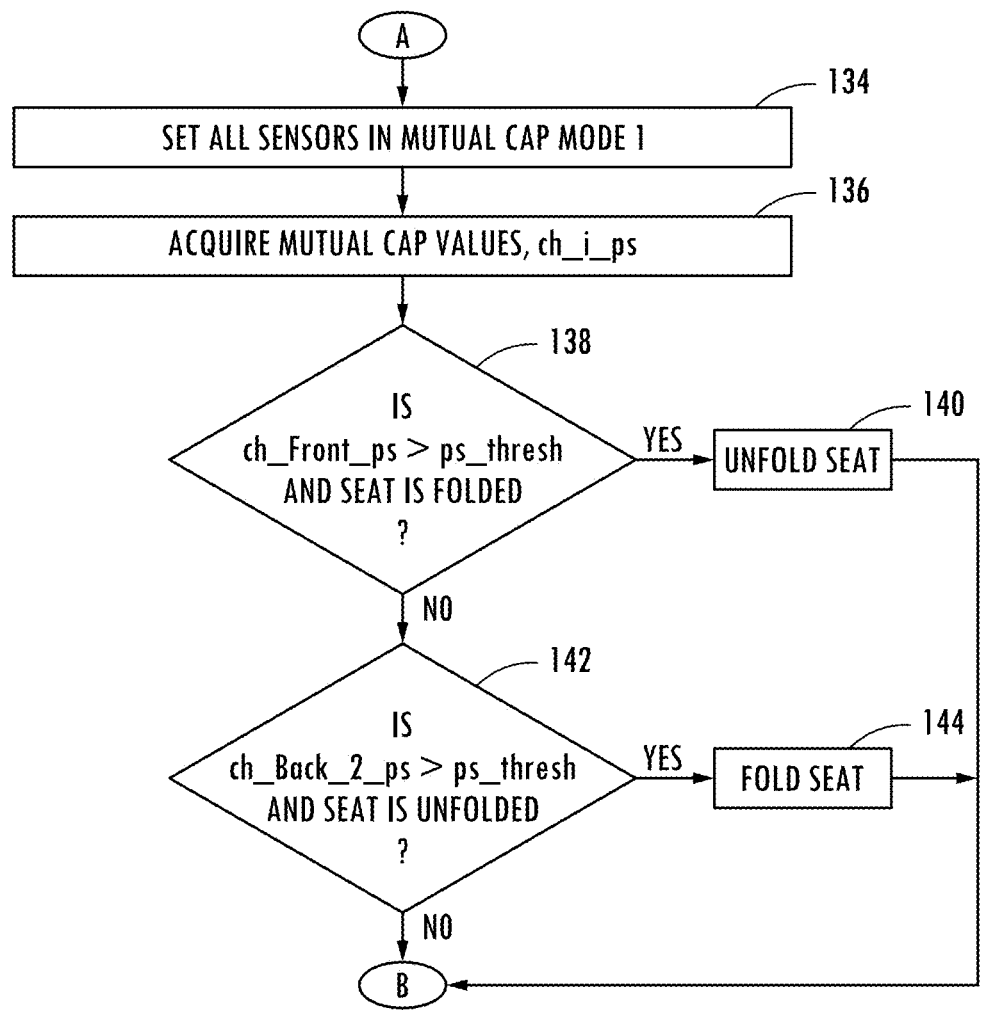

Referring to FIGS. 10A-10B, a routine 100 for controlling the switching of the capacitive proximity sensor assembly 10 amongst the various operating modes with the controller is shown, according to one embodiment. Routine 100 begins at step 102 and proceeds to step 104 to set all sensors in the mutual capacitance first sensor mode 1. It should be appreciated that routine 100 will perform an initialization and calibration for each mode once at startup. At step 106, routine 100 will calibrate and store initialization parameters in memory for first sensor mode 1. Proceeding to step 108, routine 100 will set the sensors in the self-capacitance second sensor mode 2 and will proceed to step 110 to calibrate and store the initialization parameters in memory for sensor mode 2. Routine 100 will then proceed to step 112 to set the sensors in the mutual capacitance third sensor mode 3 which is configured as a pressure sensing mode and will then calibrate and store the initialization parameters in memory for third sensor mode 3 at step 114.

Next, at step 116, routine 100 sets the sensors in a self-capacitance mode 2 and then proceeds to step 118 to acquire the self-capacitance value ch_i_s for current signal channel at step 118. At decision step 120, routine 120 determines if the acquired self-capacitance value ch_i_s is greater than a threshold value and, if so, proceeds to step 122 to detect proximity of an object and perform any desired associated action, such as turning on a seat light, for example. Following step 122 or if the signal channel ch_i_s is not greater than the threshold, routine 100 proceeds to step 124 to set the sensors in a mutual capacitance mode 1 and then to step 126 to acquire a value ch_i_m for the current signal channel. Next, at decision step 128, routine 100 determines if the last five signal values ch_i_m are stable and greater than a threshold and, if so, proceeds to decision step 130 to detect a sensor touch triggered and, if there are two sensors on the rear of the seat back, is the sensor nearer the door triggered first and, if so, routine 100 performs any desired associated actions such as turning on an audible warning that the seat will move when the sensor switch is pressed at step 132. Following step 130 or if the last five signal values ch_i_m are not stable or greater than the threshold, routine 100 proceeds to step 134 to set all of the sensors in a mutual capacitance mode 1 and then to step 136 to acquire the mutual capacitance values ch_i_ps. Next, at decision step 138, routine 100 determines if the signal for a front sensor is subjected to pressure greater than a pressure threshold when the seat is folded, and, if so, proceeds to step 140 to unfold the seat by unlatching the latch to allow the seatback to be unfolded. If the signal is not indicative of a pressure signal or if the seat is not forward, routine 100 proceeds to decision step 142 to determine if the back sensor signal is subjected to pressure greater than a pressure threshold and if the seat is unfolded, and, if so, proceeds to actuate the solenoid to unlatch the latch to fold the seat to a folded position. Routine 100 then proceeds back to step 116.

Figure 11:
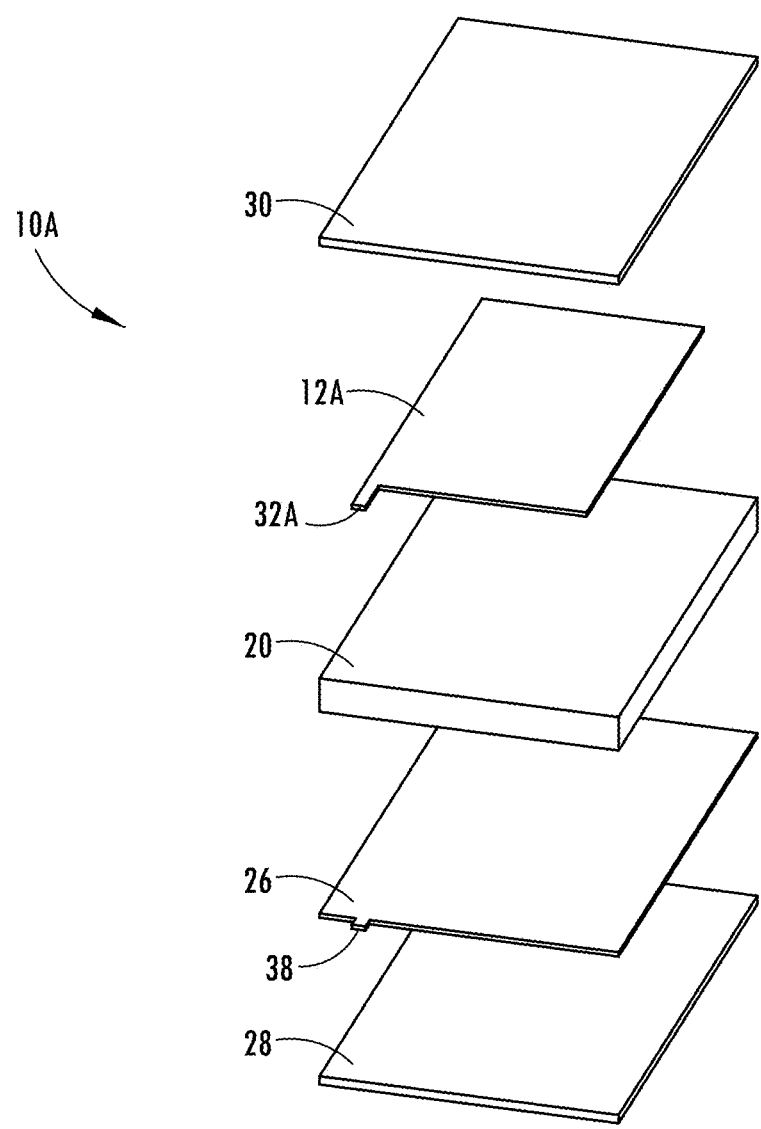
FIG. 11 is an exploded front perspective view of a capacitive proximity sensor assembly, according to a second embodiment.
Figure 12:
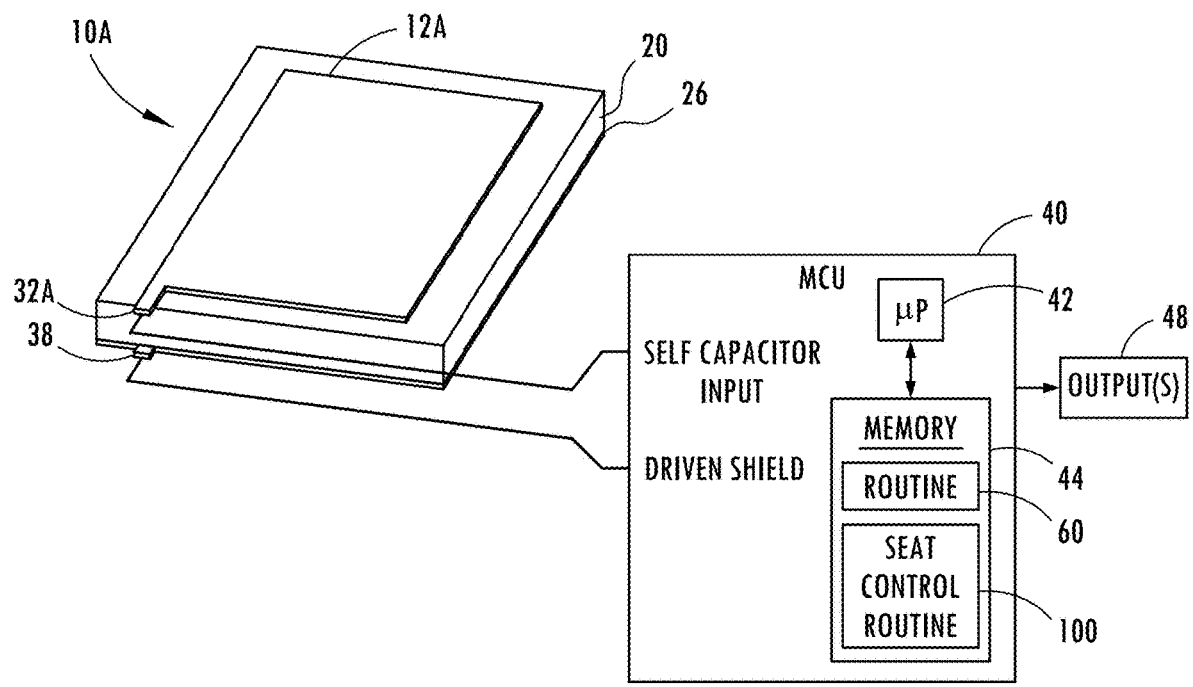
FIG. 12 is a front perspective view of the capacitive proximity sensor assembly shown in FIG. 11 and controlled by a controller to sample signals in a first sensor mode.
Figure 13:
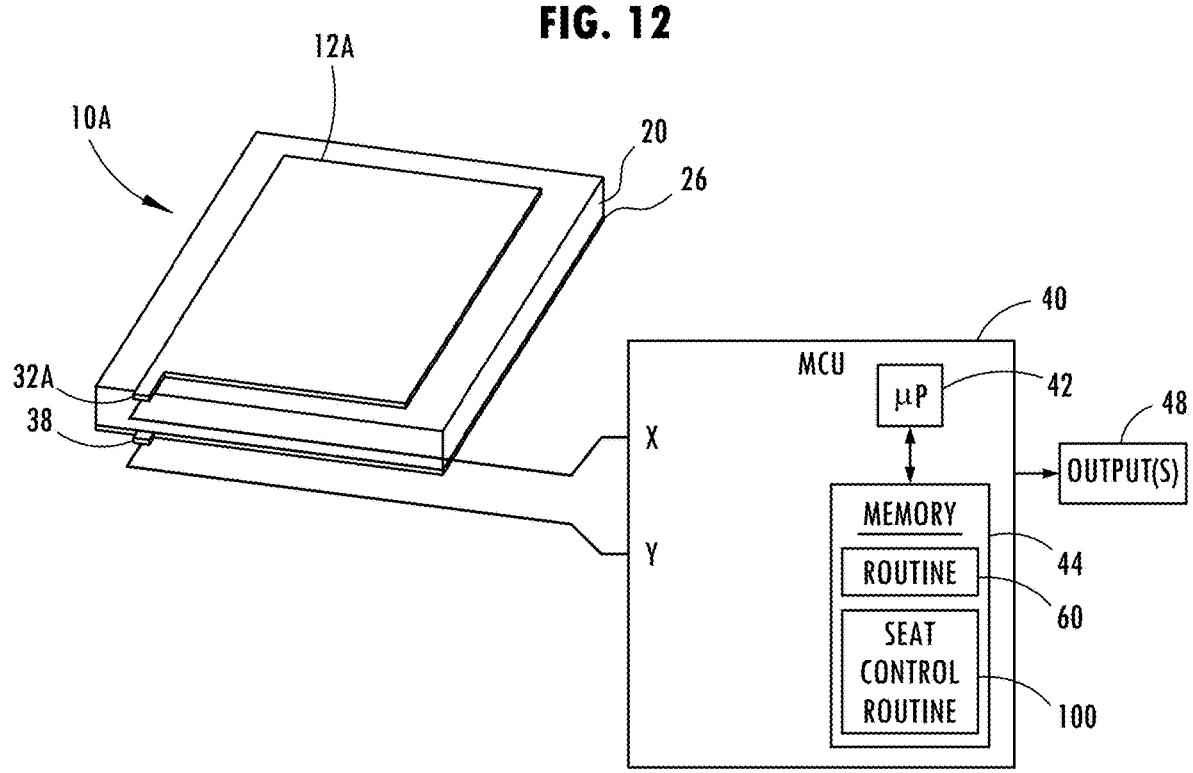
FIG. 13 is a front perspective view of the capacitive proximity sensor assembly shown in FIG. 11 and controlled by a controller to sample signals in a second sensor mode.

Referring to FIGS. 11-13, a capacitive proximity sensor assembly 10A is illustrated, according to second embodiment. In this embodiment, a first electrode 12A having a signal terminal 32A is dielectrically isolated and spaced from a second electrode 26 having a signal terminal 38 via a compliant dielectric layer 20. The compliant dielectric layer 20 may include a soft compliant layer such as foam, according to one example. The first and second electrodes 12A and 26 may each comprise a sheet of conductive material, such as a printed ink that may be printed on the top and bottom sides of the compliant layer 20. The capacitive sensor assembly 10A may further include a dielectric front layer 30 and a dielectric bottom layer 28 to dielectrically isolate the sensor and protect the conductive electrodes.

The capacitive sensor assembly 10A may be configured to operate in a first self-capacitance sensor mode to provide a first sensor as shown in FIG. 12 in which the first electrode 12A is applied with a self-capacitance input signal and subsequently senses an output signal to operate as a self-capacitance sensor and the second electrode 38 is driven to a voltage to operate as a shield. In this embodiment, proximity of an object above the top front surface may be detected with self-capacitance sensing.

The capacitive sensor assembly 10A may be configured to operate in a second mutual capacitance sensor mode to provide a second sensor as shown in FIG. 13. In this sensor mode, the first electrode 12A operates with the drive signal X and the second electrode 26 operates with the receive signal Y. As such, pressure or force applied to the front surface of the front cover 30 of the capacitive proximity sensor assembly 10A may be sensed as the compliant layer 20 squeezes due to the force or pressure so that at least a portion of electrode 12A moves toward electrode 26.

The capacitive proximity sensor assemblies 10 and 10A may be useful for sensing proximity such as a touch or a swipe on or proximate to the front surface of the cover 30, and proximity of an object more remote from the cover 30, and pressure or force applied to the front surface of the cover 30 in various applications including applications on seats onboard vehicles. The capacitive proximity sensor assembly may be employed in one or more vehicle seats to sense inputs applied to control various features related to the vehicle, such as to adjust seat position and orientation, latch and unlatch the seat back to move to the folded or unfolded positions, to actuate the seat forward and rearward and other vehicle seat controls. It should be appreciated that one or more of the capacitive sensor assemblies 10 and 10A may be employed on other vehicle surfaces and may be employed on seats and elsewhere in non-vehicle applications.

Accordingly, it should be appreciated that the one or more of the capacitive proximity sensor assemblies 10 and 10A may be employed onboard a vehicle, such as on a vehicle seat to control command inputs to the seat. However, it should be appreciated that the capacitive proximity sensor assemblies 10 and 10A may be employed on various other applications, according to other embodiments. The capacitive proximity sensor assemblies 10 and 10A advantageously allow for sensing in various sensor arrangements that sequentially change rapidly due to signal control and sampling by the microprocessor in the controller so as to detect various sensed inputs with sensors that employ shared electrodes.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle seating assembly comprising:
a seat base;
a seat back pivotally coupled to the seat base and having a front portion and a rear portion;
an actuator operable to change a position of the seating assembly;
a capacitive proximity sensor configured to detect user inputs as a user touch command and a user pressure command, wherein the capacitive proximity sensor comprises:
a first electrode;
a second electrode;
a compliant dielectric layer disposed between the first and second electrodes; and
a controller for receiving the user touch command and pressure command and controlling the actuator to change the position of the seating assembly based on the user inputs, wherein the controller processes signals associated with the first and second electrodes and selectively reconfigures operation of the first and second electrodes in different proximity sensor arrangements to provide a touch capacitive sensor for sensing the user touch command and a pressure capacitive sensor for sensing the user pressure command, and wherein the first electrode is configurable to provide the touch capacitance sensor and the first and second electrodes are configurable to provide the pressure capacitive sensor.

2. The vehicle seating assembly of claim 1, wherein the capacitive proximity sensor is located on an upper portion of the seat back.

3. The vehicle seating assembly of claim 2, wherein the capacitive proximity sensor is located on a rear portion of the seat back.

4. The vehicle seating assembly of claim 2, wherein the capacitive proximity sensor is located on a front portion of the seat back.

5. The vehicle seating assembly of claim 1, wherein the vehicle seating assembly comprises a first capacitive proximity sensor and a second capacitive proximity sensor, wherein the first and second proximity sensors are located proximate one another on one side of the seat back.

6. The vehicle seating assembly of claim 1, wherein the first electrode comprises a pair of electrodes that are configurable to generate a mutual capacitance to provide the first capacitance sensor and are further configurable to generate a self-capacitance to provide the second capacitive sensor.

7. The vehicle seating assembly of claim 6, wherein the pair of electrodes comprises a first plurality of capacitive fingers and a second plurality of capacitive fingers, wherein the first plurality of capacitive fingers are interdigitated with the second plurality of capacitive fingers.

8. The vehicle seating assembly of claim 7, wherein the first and second electrodes provide a third capacitive sensor.

9. The vehicle seating assembly of claim 8, wherein the controller sequentially samples signals associated with each of the first, second and third capacitive sensors.

10. A vehicle seating assembly comprising:
a seat base;
a seat back pivotally coupled to the seat base and having a front portion and a rear portion;
an actuator operable to change a position of the seating assembly;
a capacitive proximity sensor located on the seat back and configured to detect user inputs as a user touch command and a user pressure command, wherein the capacitive proximity sensor comprises:
a first electrode;
a second electrode;
a compliant dielectric layer disposed between the first and second electrodes; and
a controller for receiving the user touch command and pressure command and controlling the actuator to change a position of the seat back based on the user inputs, wherein the controller processes signals associated with the first and second electrodes and selectively reconfigured operation of the first and second electrodes in different proximity sensor arrangements to provide a touch capacitive sensor for sensing the user touch command and a pressure capacitive sensor for sensing the user pressure command, and wherein the first electrode is configurable to provide the touch capacitance sensor and the first and second electrodes are configurable to provide the pressure capacitive sensor.

11. The vehicle seating assembly of claim 10, wherein the capacitive proximity sensor is located on an upper portion of the seat back.

12. The vehicle seating assembly of claim 11, wherein the capacitive proximity sensor is located on a rear portion of the seat back.

13. The vehicle seating assembly of claim 11, wherein the capacitive proximity sensor is located on a front portion of the seat back.

14. The vehicle seating assembly of claim 10, wherein the vehicle seating assembly comprises a first capacitive proximity sensor and a second capacitive proximity sensor, wherein the first and second proximity sensors are located proximate one another on one side of the seat back.

15. The vehicle seating assembly of claim 10, wherein the first electrode comprises a pair of electrodes that are configurable to generate a mutual capacitance to provide the first capacitance sensor and are further configurable to generate a self-capacitance to provide the second capacitive sensor.

16. The vehicle seating assembly of claim 15, wherein the pair of electrodes comprises a first plurality of capacitive fingers and a second plurality of capacitive fingers, wherein the first plurality of capacitive fingers are interdigitated with the second plurality of capacitive fingers.

17. The vehicle seating assembly of claim 16, wherein the first and second electrodes provide a third capacitive sensor.

18. The vehicle seating assembly of claim 17, wherein the controller sequentially samples signals associated with each of the first, second and third capacitive sensors.

* * * * *